United States Patent
Govari et al.

(10) Patent No.: US 10,014,607 B1
(45) Date of Patent: Jul. 3, 2018

(54) PCB SUB-CONNECTORS

(71) Applicant: BIOSENSE WEBSTER (ISRAEL) LTD., Yokneam (IL)

(72) Inventors: Assaf Govari, Haifa (IL); Yehuda Algawi, Binyamina (IL); Ilya Sitnitsky, Nahariya (IL)

(73) Assignee: Bionsense Webster (Israel) Ltd., Yokneam (IL)

( * ) Notice: Subject to any disclaimer, the term of this patent is extended or adjusted under 35 U.S.C. 154(b) by 0 days.

(21) Appl. No.: 15/456,740

(22) Filed: Mar. 13, 2017

(51) Int. Cl.
  H01R 12/71    (2011.01)
  H01R 43/20    (2006.01)
  H01R 24/58    (2011.01)
  H01R 13/645   (2006.01)
  H01R 13/627   (2006.01)

(52) U.S. Cl.
  CPC ....... H01R 12/714 (2013.01); H01R 13/6456 (2013.01); H01R 24/58 (2013.01); H01R 43/205 (2013.01); *H01R 13/6273* (2013.01)

(58) Field of Classification Search
  CPC ............................ H01R 43/205; H01R 12/714
  See application file for complete search history.

(56) References Cited

U.S. PATENT DOCUMENTS

| | | | | |
|---|---|---|---|---|
| 3,060,417 A | * | 10/1962 | Blake .................... | B64D 45/02 340/508 |
| 4,373,764 A | * | 2/1983 | Ulrich ................... | H01R 12/85 29/854 |
| 4,376,927 A | * | 3/1983 | McGalliard .......... | H01H 85/046 174/254 |
| 6,162,065 A | * | 12/2000 | Benham ................ | H01R 12/79 439/493 |
| 6,733,319 B1 | | 5/2004 | Jorgensen | |
| 7,261,580 B1 | * | 8/2007 | Secora .................. | H01R 12/83 439/341 |
| 8,784,138 B2 | * | 7/2014 | Shih ...................... | H01R 24/58 439/668 |
| 8,821,194 B2 | * | 9/2014 | Shih ...................... | H01R 13/518 439/668 |
| 9,017,092 B1 | * | 4/2015 | McCracken .......... | H01R 13/62 439/374 |

(Continued)

FOREIGN PATENT DOCUMENTS

KR     2004061873 A    7/2004

OTHER PUBLICATIONS

Pending U.S. Appl. No. 14/978,479, filed Dec. 22, 2015.

*Primary Examiner* — James Harvey (57) ABSTRACT

A connector for a catheter has a female-connector body with at least one mating surface. The mating surface is an inner surface of the female-connector body adapted to an outer surface of a male-connector body that has electrically conductive male-connector terminals thereon. One or more printed circuit boards are coupled to the inner surface of the female-connector body. The printed circuit boards have electrically conductive female-connector terminals that contact a respective one of the male-connector terminals when the male-connector body is inside the female-connector body. The printed circuit boards have terminations that are linked to the female-connector terminals, wherein the terminations respectively comprise a first subconnector in galvanic contact with the printed circuit boards and configured to mate with a second subconnector.

10 Claims, 5 Drawing Sheets

(56) References Cited

U.S. PATENT DOCUMENTS

| | | | |
|---|---|---|---|
| 9,314,208 B1* | 4/2016 | Altmann | A61B 5/6858 |
| 2003/0232517 A1 | 12/2003 | Liu et al. | |
| 2004/0053532 A1* | 3/2004 | Jones | H01R 4/242 |
| | | | 439/581 |
| 2004/0058565 A1* | 3/2004 | Norland | H01R 12/62 |
| | | | 439/67 |
| 2006/0228922 A1 | 10/2006 | Morriss | |
| 2010/0248503 A1 | 9/2010 | Kang et al. | |
| 2011/0081788 A1* | 4/2011 | Robb | G02B 6/3604 |
| | | | 439/8 |
| 2013/0244453 A1* | 9/2013 | Sakamoto | H01R 12/53 |
| | | | 439/55 |
| 2015/0094713 A1* | 4/2015 | Pham | H01R 13/6205 |
| | | | 606/41 |
| 2017/0063005 A1* | 3/2017 | Wang | G02B 6/3684 |
| 2017/0082655 A1* | 3/2017 | Rosenberg | G01R 1/0416 |
| 2017/0172652 A1* | 6/2017 | Govari | A61B 18/1492 |
| 2017/0179631 A1* | 6/2017 | Feldchtein | H01R 13/44 |

\* cited by examiner

PCB SUB-CONNECTORS

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

This invention relates to electrically conductive connectors. More particularly, this invention relates to a coupling device having a plurality of mutually insulated connective elements that is adapted for contact with generally planar structures such as printed circuit boards.

2. Description of the Related Art

In some applications, a catheter having multiple electrodes at its distal end is used to sense and/or ablate cardiac tissue. In such applications, sufficient wiring needs to be provided for the passage of electrical signals between the proximal and distal ends of the catheter.

One example of a connector using printed circuit boards is disclosed in U.S. Patent Application Publication No. 20060228922. A disclosed electrical connector comprises a first flexible printed circuit board comprising a first electrical contact area, and an elastic biasing element to bias the first electrical contact area in at least one direction. A second printed circuit board, comprising a second electrical contact area, wherein the elastic biasing element is to bias the first electrical contact area toward the second electrical contact area to form a substantially coplanar electrical connection between the first and second electrical contact areas.

Commonly assigned copending application Ser. No. 14/978,479, which is herein incorporated by reference, describes a connector for a cardiac catheter. The connector includes a connector body including at least one mating surface having a first longitudinal end, and a second longitudinal end that is narrower than the first longitudinal end. A plurality of electrically-conductive terminals are coupled to the mating surface of the connector body.

SUMMARY OF THE INVENTION

Measurements of signals are acquired simultaneously from high numbers of electrodes in a heart chamber. The electrodes are on catheters such as a basket catheter, a PentaRay® catheter, or a balloon catheter. The signals are effectively baseband, and so an equivalent number of conductors must be connected to the electrodes. This necessitates connectors capable of handling such large numbers of conductors (in some applications, approximately 400 conductors). In addition, it is important to simplify the assembly of the individual terminations of the connectors.

There is provided according to embodiments of the invention a connector having a female-connector body with at least one mating surface. The female-connector body has a first longitudinal end, and a second longitudinal end that is narrower than the first longitudinal end. The mating surface is an inner surface of the female-connector body adapted to an outer surface of a male-connector body that has electrically conductive male-connector terminals thereon. One or more printed circuit boards are coupled to the inner surface of the female-connector body. The printed circuit boards have electrically conductive female-connector terminals that contact a respective one of the male-connector terminals when the male-connector body is inside the female-connector body. The printed circuit boards have terminations that are linked to the female-connector terminals, wherein the terminations respectively comprise a first subconnector in galvanic contact with the printed circuit boards and configured to mate with a second subconnector.

An aspect of the apparatus includes PCB contacts on the terminations of the printed circuit boards that are linked to respective ones of the female-connector terminals, wherein the first subconnector has a plurality of first electrical contacts with respective ones of the PCB contacts and a plurality of second electrical contacts. The second electrical contacts are electrically connected to the first electrical contacts to conduct electrical signals to respectively aligned elements of the second subconnector when the first subconnector mates with the second subconnector.

According to still another aspect of the apparatus, the second electrical contacts of the first subconnector are slots dimensioned to receive respective pins of the second subconnector.

According to a further aspect of the apparatus, the first subconnector is one of a female subconnector and a male subconnector and the second subconnector is another of the female subconnector and the male subconnector.

According to one aspect of the apparatus, the female-connector body is shaped to define at least one protrusion that protrudes from the second longitudinal end of the female-connector body toward the first longitudinal end of the female-connector body, wherein the protrusion is not at a transverse center of the female-connector body.

There is further provided according to embodiments of the invention a method of manufacture, which is carried out by providing a female-connector body having at least one mating surface, a first longitudinal end, and a second longitudinal end that is narrower than the first longitudinal end. The method is further carried out by providing printed circuit boards adapted to the mating surface and having a plurality of electrically-conductive female-connector terminals disposed so as to contact electrical male-connector terminals of a male connector body. The printed circuit boards has terminations and PCB contacts on the terminations that are linked to respective ones of the female-connector terminals. The method is further carried out by inserting the printed circuit boards into the female-connector body, and prior to inserting the printed circuit boards, attaching respective first subconnectors in galvanic contact with the PCB contacts of the terminations, wherein the first subconnectors are configured to mate with second subconnectors.

BRIEF DESCRIPTION OF THE SEVERAL VIEWS OF THE DRAWINGS

For a better understanding of the present invention, reference is made to the detailed description of the invention, by way of example, which is to be read in conjunction with the following drawings, wherein like elements are given like reference numerals, and wherein.

DETAILED DESCRIPTION OF THE INVENTION

In the following description, numerous specific details are set forth in order to provide a thorough understanding of the various principles of the present invention. It will be apparent to one skilled in the art, however, that not all these details are necessarily needed for practicing the present invention. In this instance, well-known circuits, control logic, and the details of computer program instructions for conventional algorithms and processes have not been shown in detail in order not to obscure the general concepts unnecessarily.

Documents incorporated by reference herein are to be considered an integral part of the application except that, to the extent that any terms are defined in these incorporated documents in a manner that conflicts with definitions made explicitly or implicitly in the present specification, only the definitions in the present specification should be considered.

The terms "link", "links", "couple" and "couples" are intended to mean either an indirect or direct connection. Thus, if a first device couples to a second device, that connection may be through a direct connection, or through an indirect connection via other devices and connections.

A catheter having multiple electrodes at its distal end typically requires multiple connecting wires terminating in respective connectors at a proximal end of the catheter. Some catheters, e.g., basket catheters, may have upwards of 100 electrodes, and correspondingly a relatively large number of connecting wires.

One possibility is to have the wires terminate in a single, two-dimensional rectilinear arrangement of sockets in a female connector at the proximal end of the catheter, the sockets mating with pins of a corresponding male connector (or vice versa). To accommodate the large number of pins and sockets needed, however, the male and female connectors may need to be undesirably large in one or both of the two dimensions. Although it may be possible to densely pack the pins and sockets, such a solution may be relatively expensive.

Embodiments of the present invention accommodate the large number of connecting wires by providing a conically-shaped, or otherwise suitably-shaped, connector. A plurality of electrically-conductive connecting terminals are coupled to at least one mating surface of the connector between the longitudinal ends of the connector. For example, for a female connector, the terminals are coupled to an inside surface of the connector. Such a configuration advantageously utilizes a third, longitudinal dimension of the connector that is not utilized in the above-described single, two-dimensional rectilinear arrangement. Thus, a relatively large number of terminals may be coupled to the connector, without overly increasing the length of the connector in any dimension, and without needing to pack the terminals too densely. For example, in some embodiments, the connector may comprise more than 100 (e.g., 100-500), or even more than 500 (e.g., 500-700) terminals.

In some embodiments, flexible printed circuit boards (PCBs) are coupled to the mating surface of the connector, and terminals on the PCBs are used as the connecting terminals. In some embodiments, a compressible layer of material is coupled to the connector body, underneath the PCBs. The compressible layer of material pushes the PCBs away from the connector, towards the complementary connector, thus improving the contact between the respective sets of terminals.

Some connectors described herein are configured to largely prevent any unwanted contact between the terminals as the male connector is in the process of being inserted into the female connector. For example, in some embodiments, an electrically-insulative connector sheath inhibits contact between the terminals, until the male connector is fully inserted into (and correctly oriented with respect to) the female connector. In other embodiments, the connectors are shaped and/or sized to allow full insertion of the male connector into the female connector without any contact between the terminals. Only upon the male connector being fully inserted, are the terminals of the male connector brought into contact with the terminals of the female connector.

Figure 1:
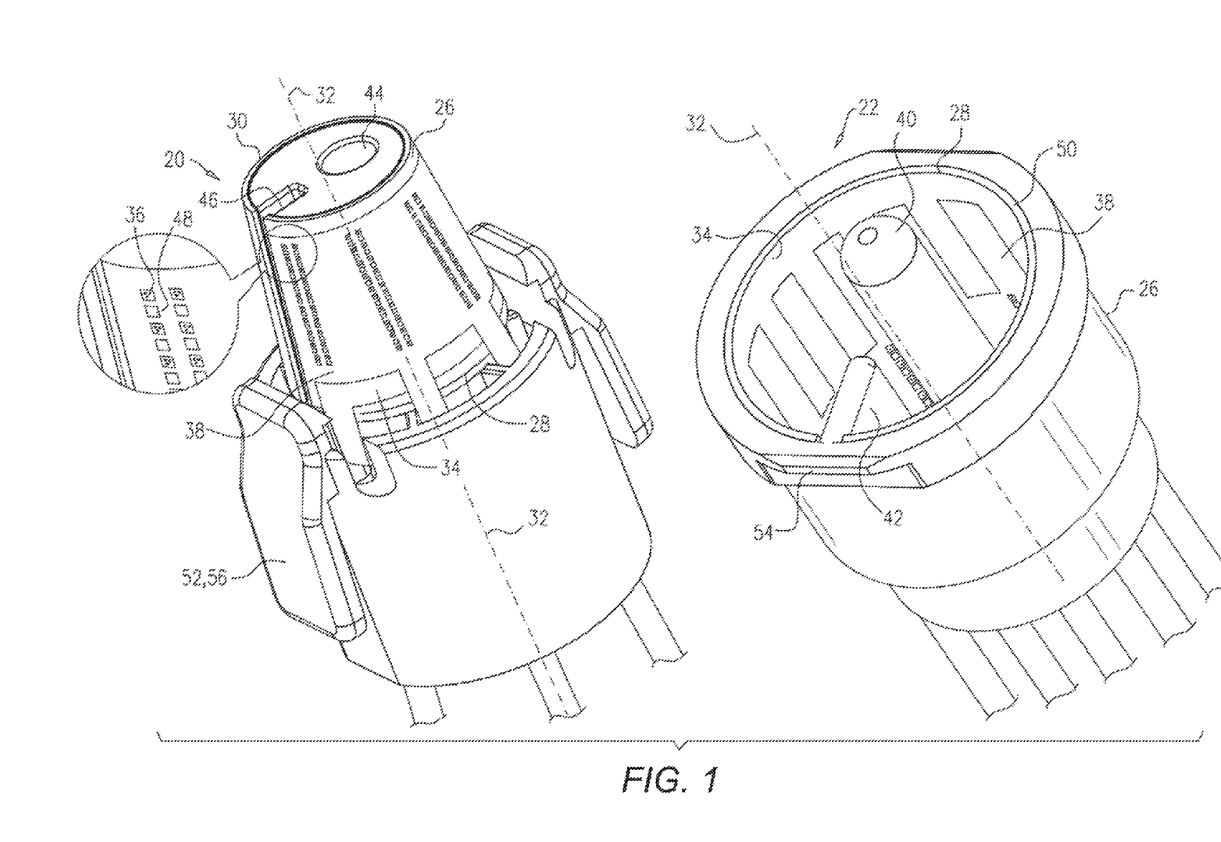
FIG. 1 is a schematic illustration of a male connector and a female connector, which is employed in some embodiments of the present invention.

Turning now to the drawings, reference is initially made to FIG. 1, which is a schematic illustration of a male connector 20 and a female connector 22, in accordance with some embodiments of the present invention.

Each one of the connectors comprises a connector body 26 comprising at least one mating surface 34, having a first longitudinal end 28, and a second longitudinal end 30 that is narrower than first longitudinal end 28. For example, as shown in FIG. 1, surface 34 may be conically-shaped, i.e., shaped to define at least a portion of a cone. For each of the connectors, a plurality of electrically-conductive terminals 36 are coupled to surface 34, between the first and second longitudinal ends of the connector body. The respective shapes of the connector bodies are complementary, such that the female-connector body is shaped to fittingly receive the male connector.

The respective surfaces 34 are referred to herein as "mating surfaces," in that the connectors mate with one another by the terminals on one of the mating surfaces contacting the terminals on the other one of the mating surfaces. Connector 22 is referred to herein as a female connector, in that the terminals of connector 22 are coupled to an inner surface of the body of connector 22; in other words, the mating surface of connector 22 is an inner surface of the connector. Conversely, connector 20 is referred to herein as a male connector, in that the terminals of connector 20 are coupled to an outer surface of the body of connector 20; in other words, the mating surface of connector 20 is an outer surface of the connector. Each of the female-connector terminals is positioned to contact a respective one of the male-connector terminals, when the male connector is inside the female connector.

Typically, terminals 36 belong to one or more PCBs 38 coupled to surface 34. PCBs 38 are typically relatively flexible, such that they conform to the mating surface of the connector body. PCBs 38 may be shaped to define the terminals, or the terminals may be attached (e.g., soldered) to the PCBs. In alternate embodiments, the terminals do not belong to PCBs. For example, in some embodiments, the terminals are painted or 3D-printed onto the mating surface of the connector body.

In some embodiments, at least one of the connectors comprises a compressible layer 50 of material between at least a portion of the connector body and the terminals. Layer 50 provides a pushing force that facilitates contact between the complementary sets of terminals. Layer 50 may comprises, for example, polyester, microcellular urethane such as a PORON® microcellular urethane foam, or silicone. Layer 50 is typically over-molded onto the connector body.

Figure 2:
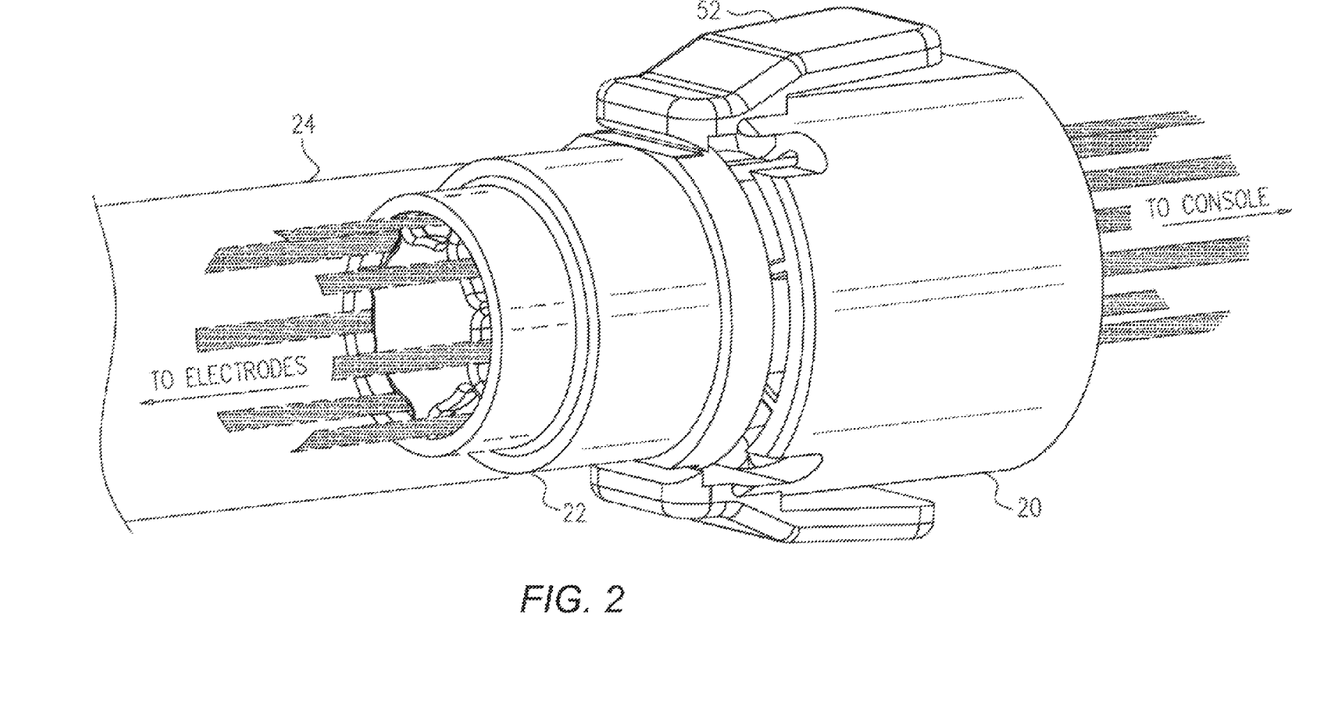
FIG. 2 is a schematic illustration of the male connector and the female connector shown in FIG. 1 in a mating position, in accordance with some embodiments of the present invention.

Reference is now made to FIG. 2, which is a schematic illustration of male connector 20 and female connector 22 in a mating position, in accordance with some embodiments of the present invention. As shown in FIG. 2, in some embodiments, female connector 22 is disposed at the proximal end of a catheter 24, such as within, or partially within, catheter 24. As described above, catheter 24 may comprise a plurality of electrodes (not shown) at a distal end thereof, each of the electrodes being connected to a terminal on the female connector. For example, each of the electrodes may be connected to a respective one of the terminals. Alternatively, one or more of the terminals may be "shared" by multiple electrodes, using, for example, multiplexing techniques.

Each of the terminals on the male connector may be connected to, for example, a radiofrequency generator (for ablation) and/or an electrocardiogram monitor, e.g., disposed inside a console at the proximal side of the catheter.

In alternative embodiments, the male connector is disposed at the proximal end of the catheter, such as within, or partially within, the catheter, and the female connector is disposed outside the catheter.

In some embodiments, the female-connector body is shaped to define at least one protrusion that protrudes from second longitudinal end 30 of the female-connector body toward first longitudinal end 28 of the female-connector body. For example, FIG. 1 shows a first protrusion 40, which does not contact the inner surface of the female-connector body (i.e., the mating surface to which the terminals are coupled), and a second protrusion 42, which contacts the inner surface. In such embodiments, second longitudinal end 30 of the male connector is shaped to define at least one complementary orifice. For example, FIG. 1 shows a first orifice 44, which receives first protrusion 40, and a second orifice 46, which receives second protrusion 42. (First orifice 44 is completely enclosed by the second longitudinal end of the male-connector body, while second orifice 46 is not.)

The first protrusion 42 is not at the transverse center of the female-connector body (and likewise, the first orifice is not at the transverse center of the male-connector body). Hence, the first protrusion 42 and first orifice 44 "break the symmetry" of the connectors, such that only one mating position is possible. In other words, the first protrusion 42 and first orifice 44 help the connectors be aligned such that each male-connector terminal comes into contact with the appropriate female-connector terminal. Moreover, first protrusion 40 helps prevent a finger from accidentally touching one of the female-connector terminals.

Second protrusion 42, along with second orifice 46, help prevent unwanted "jiggling" of the connectors (and hence, unwanted contact between the terminals), as the connectors are mated with one another. Second protrusion 42 and second orifice 46 also provide for proper alignment between the connectors, as described above for the first protrusion and first orifice. In some embodiments, second protrusion 42 and second orifice 46 also act as a "key" that prevents the wrong pair of connectors from being mated with one another.

Figure 3:
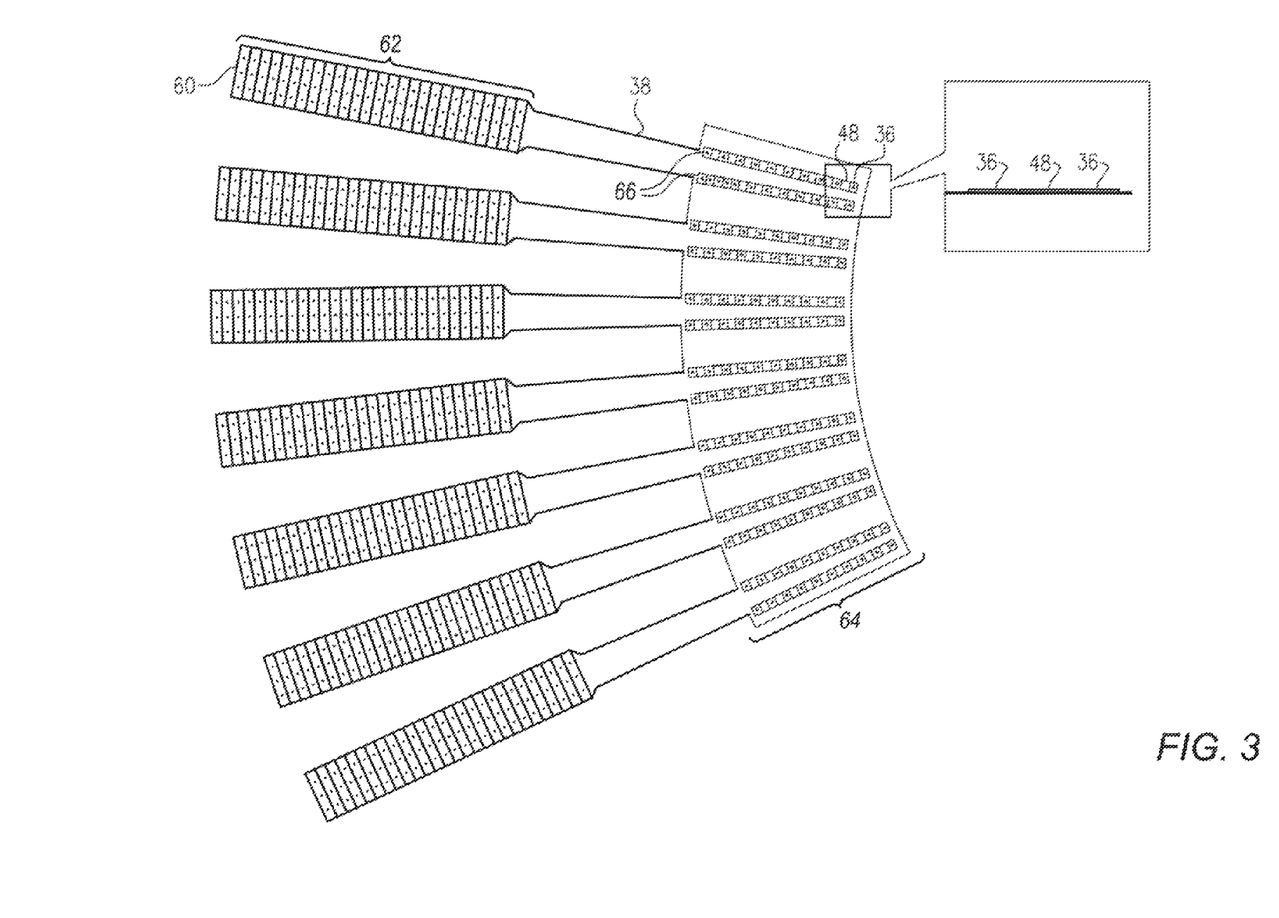
FIG. 3, which is a schematic illustration of a PCT, which is employed in embodiments of the present invention.

Reference is now made to FIG. 3, which is a schematic illustration of PCB 38, which is suitable for use with embodiments of the present invention. The PCBs 38 have a distal section 62 provided with a row of connecting elements 60 and a proximal section 64 provided with two rows of connecting elements 66. The terms "distal" and "proximal" are used arbitrarily herein to distinguish two distinct sections of the PCB. These terms have no physical meanings with respect to the actual configuration of the PCB and the connecting elements in a connector.

In some embodiments, at least one of the PCBs 38 comprises, between at least one pair of neighboring terminals 36, a spacing element 48 (also shown in FIG. 1) that is level with the pair of terminals 36, i.e., the spacing element 48 protrudes the same distance from the PCB as do the terminals 36. (Typically, as shown in FIG. 3, there is a respective spacing element 48 between each pair of neighboring terminals.) Spacing element 48 facilitates the mating of the connectors with one another, by filling up the space between the terminals that might otherwise "catch" a terminal of the complementary connector. In the particular embodiment shown in FIG. 3, the end of PCB 38 that is opposite the terminals 36 comprises connecting elements 60, which facilitate the connection of the terminals to connecting wires (not shown) that run to the electrodes, or to the radiofrequency generator, electrocardiogram monitor, and/or other apparatus at the proximal end of the catheter.

In some embodiments, at least some of the terminals on one of the connectors are pins, and at least some of the terminals on the other one of the connectors are sockets, shaped to receive the pins.

Further details of the connectors 20, 22 and the PCBs 38 (FIG. 1) are disclosed in the above-noted application Ser. No. 14/978,479.

As noted above, measurements of signals will be acquired simultaneously from high numbers (~400) of electrodes in a heart chamber and routed through the connectors 20, 22. According to embodiments of the invention assembly of the connections between the connecting wires (not shown) and the terminals 36 is facilitated by subconnectors that are attached to the terminals 36. The terminals 36 and the subconnectors are constructed so as to interlock in stable galvanic contact.

Figure 4:
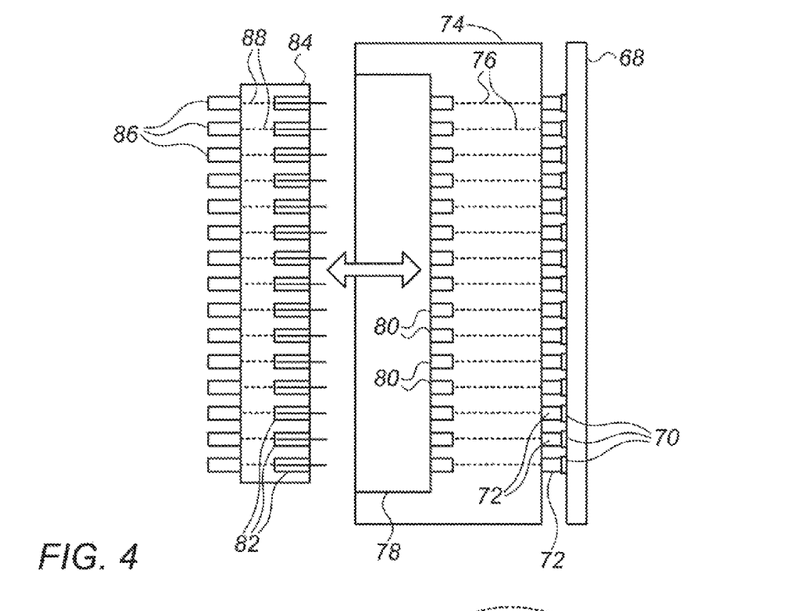
FIG. 4 is a schematic side elevation of a portion of a PCB in a connector in accordance with an embodiment of the invention.

Reference is now made to FIG. 4, which is a schematic side elevation of a portion of a PCB 68 in a connector in accordance with an embodiment of the invention. The PCB 68 represents portions of the connecting elements 60, and terminals 36 shown in sections of the PCBs 38 (FIG. 3). An array of electrical contacts 70 attach to the PCB 68 by one of the methods described above. Pins 72 of a female subconnector 74 is fixed in galvanic contact with the electrical contacts 70, e.g., by soldering, to conduct respective signals via wires 76 from the catheter electrodes via the connectors 20, 22 (FIG. 1) through the subconnector 74, as shown representatively by broken lines. The electrical contacts 70 are linked by conductors (not shown) on the PCB 68 to connecting elements 66 (FIG. 3).

The subconnector 74 has a socket portion 78 having socket contacts, e.g., slots 80 for receiving pins 82 of a male subconnector 84, which engages the socket portion 78 as shown by an arrow. The pins 82 enter the slots 80 and conduct signals via wires 88 leading from the slots 80 to wire stubs 86, as indicated representatively by broken lines.

Figure 5:
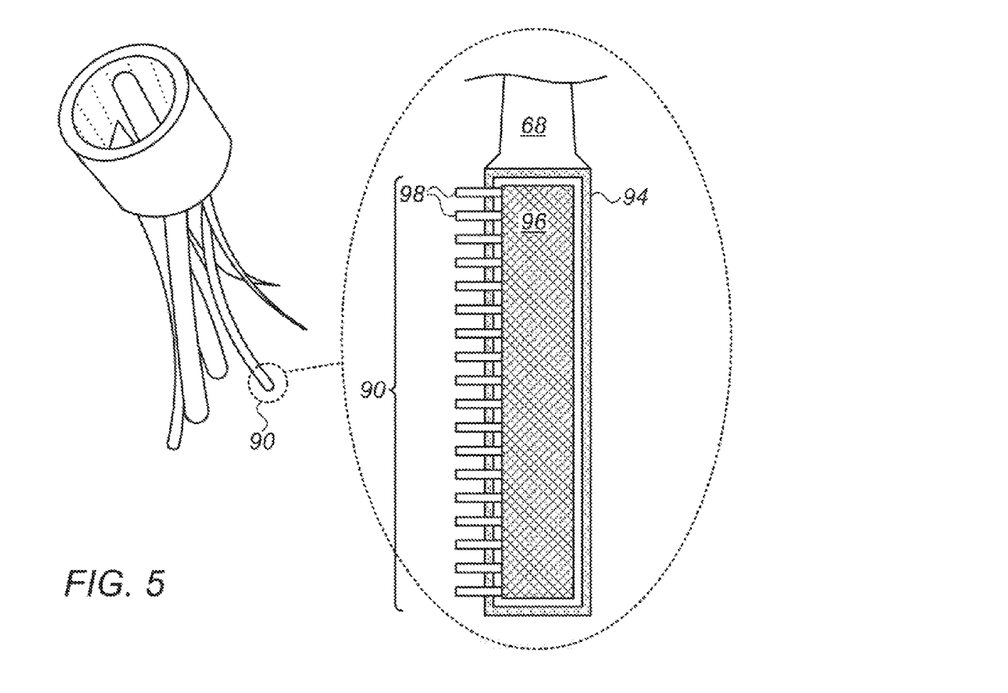
FIG. 5 is a composite schematic view of a termination of the PCB of a female connector, in accordance with an embodiment of the invention.

Reference is now made to FIG. 5, which is a composite schematic top view of a termination 90 of the PCB 68 of a female connector 92, in accordance with an embodiment of the invention. A female subconnector 94 attaches to PCB 68 at the termination 90. Male subconnector 96 is received in the female subconnector 94. Wire stubs 98 extending from the male subconnector 96 are connectable to catheter electrodes (not shown). During manufacture, the female subconnector 94 can be automatically attached to the PCB 68 prior to insertion of the PCB 68 into the female connector 92. This simplifies the overall assembly of the female connector 92 and its terminations.

Alternate Embodiment

Figure 6:
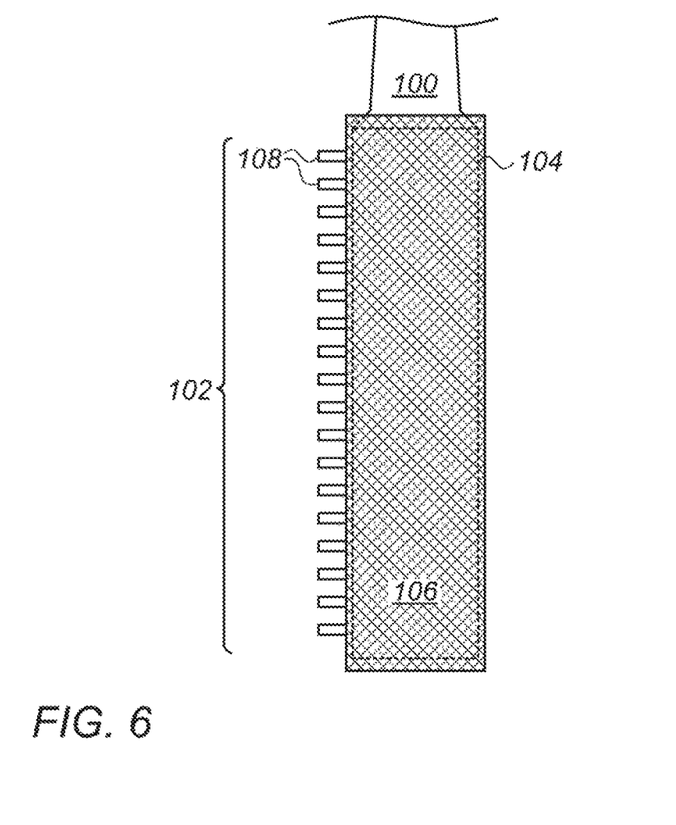
FIG. 6 is a schematic top view of a termination of the PCB of a female connector, in accordance with an alternate embodiment of the invention.

Reference is now made to FIG. 6, which is a top view of a PCB 100 having a termination 102, in accordance with an alternate embodiment of the invention. This embodiment differs from the previous embodiment in that male subconnector 104 attaches to PCB 100. Female subconnector 106 fits over the male subconnector 104 to mate with it. Wire stubs 108 extend from the female subconnector 106 and connect to catheter electrodes (not shown).

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

The invention claimed is:

1. An apparatus, comprising:
a female-connector body comprising at least one mating surface having a first longitudinal end, and a second longitudinal end that is narrower than the first longitudinal end, wherein the mating surface is an inner surface of the female-connector body adapted to an outer surface of a male-connector body having electrically conductive male-connector terminals; and
one or more printed circuit boards coupled to the inner surface of the female-connector body, the printed circuit boards having electrically conductive female-connector terminals to contact a respective one of the male-connector terminals when the male-connector body is inside the female-connector body, the printed circuit boards having terminations that are linked to the female-connector terminals, wherein the terminations respectively comprise a first subconnector in galvanic contact with the printed circuit boards and configured to mate with a second subconnector.

2. The apparatus according to claim 1, further comprising PCB contacts on the terminations of the printed circuit boards that are linked to respective ones of the female-connector terminals, wherein the first subconnector has a plurality of first electrical contacts with respective ones of the PCB contacts and a plurality of second electrical contacts, wherein the second electrical contacts are electrically connected to the first electrical contacts to conduct electrical signals to respectively aligned elements of the second subconnector when the first subconnector mates with the second subconnector.

3. The apparatus according to claim 2, wherein the second electrical contacts of the first subconnector are slots dimensioned to receive respective pins of the second subconnector.

4. The apparatus according to claim 1, wherein the first subconnector is one of a female subconnector and a male subconnector and the second subconnector is another of the female subconnector and the male subconnector.

5. The apparatus according to claim 1, wherein the female-connector body is shaped to define at least one protrusion that protrudes from the second longitudinal end of the female-connector body toward the first longitudinal end of the female-connector body, the protrusion not being at a transverse center of the female-connector body.

6. A method of manufacture, comprising the steps of:
providing a female-connector body comprising at least one mating surface having a first longitudinal end, and a second longitudinal end that is narrower than the first longitudinal end,
providing printed circuit boards adapted to the mating surface and having plurality of electrically-conductive female-connector terminals disposed so as to contact electrical male-connector terminals of a male connector body, the printed circuit boards having terminations and PCB contacts on the terminations that are linked to respective ones of the female-connector terminals;
inserting the printed circuit boards into the female-connector body; and
prior to inserting the printed circuit boards, attaching respective first subconnectors in galvanic contact with the PCB contacts of the terminations, the first subconnectors being configured to mate with second subconnectors.

7. The method of manufacture according to claim 6, wherein the first subconnectors have a plurality of first electrical contacts with respective ones of the PCB contacts and a plurality of second electrical contacts, wherein the second electrical contacts are electrically connected to the first electrical contacts to conduct electrical signals to respectively aligned elements of the second subconnectors when the first subconnectors mate with the second subconnectors.

8. The method of manufacture according to claim 7, wherein the second electrical contacts of the first subconnectors are slots dimensioned to receive respective pins of the second subconnectors.

9. The method of manufacture according to claim 6, wherein the first subconnectors are one of a female subconnector and a male subconnector and the second subconnectors are another of the female subconnector and the male subconnector.

10. The method of manufacture according to claim 6, further comprising shaping the female-connector body to define at least one protrusion that protrudes from the second longitudinal end of the female-connector body toward the first longitudinal end of the female-connector body, the protrusion not being at a transverse center of the female-connector body.

* * * * *